(12) United States Patent
Nagatani et al.

(10) Patent No.: US 7,606,104 B2
(45) Date of Patent: Oct. 20, 2009

(54) SEMICONDUCTOR MEMORY DEVICE AND ELECTRIC POWER SUPPLY METHOD

(75) Inventors: Emiko Nagatani, Kawasaki (JP); Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 11/875,260

(22) Filed: Oct. 19, 2007

(65) Prior Publication Data

US 2008/0279006 A1 Nov. 13, 2008

(30) Foreign Application Priority Data

Oct. 19, 2006 (JP) .............................. 2006-285473

(51) Int. Cl.
*G11C 5/14* (2006.01)
(52) U.S. Cl. .................. 365/226; 365/227; 365/185.23; 365/189.09
(58) Field of Classification Search ................. 365/226, 365/227, 185.23, 189.09
See application file for complete search history.

(56) References Cited

U.S. PATENT DOCUMENTS

| | | | | |
|---|---|---|---|---|
| 4,903,236 | A * | 2/1990 | Nakayama et al. ..... | 365/185.28 |
| 5,544,102 | A | 8/1996 | Tobita et al. | |
| 5,548,557 | A * | 8/1996 | Futatsuya et al. ........... | 365/201 |
| 5,553,026 | A * | 9/1996 | Nakai et al. .................. | 365/201 |
| 5,999,479 | A * | 12/1999 | Park et al. .............. | 365/230.06 |
| 6,195,291 | B1 * | 2/2001 | Dallabora et al. ...... | 365/185.23 |
| 6,222,779 | B1 * | 4/2001 | Saito et al. ............. | 365/189.09 |
| 6,288,945 | B1 * | 9/2001 | Kawashima et al. ... | 365/185.23 |
| 6,337,807 | B2 * | 1/2002 | Futatsuyama et al. .. | 365/185.17 |
| 6,373,780 | B1 * | 4/2002 | Micheloni et al. ...... | 365/230.06 |
| 6,377,502 | B1 * | 4/2002 | Honda et al. ........... | 365/230.03 |
| 6,438,052 | B1 | 8/2002 | Sekine | |
| 6,587,375 | B2 * | 7/2003 | Chung et al. ........... | 365/185.13 |
| 6,603,700 | B2 * | 8/2003 | Aruga ........................ | 365/226 |
| 6,671,203 | B2 * | 12/2003 | Tanzawa et al. ........ | 365/185.11 |
| 6,711,058 | B1 * | 3/2004 | Hirano ................... | 365/185.11 |
| 6,768,682 | B2 * | 7/2004 | Yano et al. ............. | 365/185.28 |
| 6,768,688 | B2 * | 7/2004 | Mihara ................... | 365/189.11 |
| 7,009,882 | B2 * | 3/2006 | Chen ..................... | 365/185.18 |
| 2001/0003509 | A1 * | 6/2001 | Hosono et al. ......... | 365/185.05 |

FOREIGN PATENT DOCUMENTS

JP 6-188387 7/1994

* cited by examiner

*Primary Examiner*—Viet Q Nguyen
(74) *Attorney, Agent, or Firm*—Oblon, Spivak, McClelland, Maier & Neustadt, L.L.P.

(57) ABSTRACT

A semiconductor device includes a first and a second memory cell array each including a plurality of electrically reprogrammable memory cells arranged in the form of a matrix, the first memory cell array having a larger capacity than the second memory cell array; a plurality of word and bit lines connected to the memory cells; a data program and read control section including a plurality of decoders for, when performing data programming, read or erasure with respect to a corresponding memory cell, selecting, and applying a voltage to corresponding word and bit lines; and a power supply circuit for supplying power to the data program and read control section; wherein when the power supply circuit is to supply power to the second memory cell array, an output terminal of the power supply circuit is electrically connected to at least one of the decoders connected to the first memory cell array.

20 Claims, 4 Drawing Sheets

SEMICONDUCTOR MEMORY DEVICE AND ELECTRIC POWER SUPPLY METHOD

CROSS REFERENCE TO RELATED APPLICATION

This application is based upon and claims the benefit of priority from the prior Japanese Patent Application No. 2006-285473, filed on Oct. 19, 2006; the entire contents of which are incorporated herein by reference.

BACKGROUND OF THE INVENTION

1. Field of the Invention

The present invention relates to a semiconductor memory device including a plurality of memory cell arrays each of which includes a plurality of electrically reprogrammable memory cells arranged in the form of a matrix, and an electric power supply method for such a semiconductor device.

2. Description of the Related Art

An exemplary semiconductor memory device includes a main part memory cell array and a ROM memory cell array each of which includes a plurality of electrically reprogrammable memory cells arranged in the form of a matrix, a plurality of word lines and a plurality of bit lines connected to the plurality of memory cells, a data program and read control section for, when performing data programming, read or erasure with respect to a corresponding memory cell among the plurality of memory cells, selecting a corresponding word line and a corresponding bit line among the plurality of word lines and the plurality of bit lines and applying a voltage to the selected word line and bit line, and a power supply circuit for supplying power to the data program and read control section.

The main part memory cell array has a larger capacity (about three times larger) than the ROM memory cell array.

In general, a semiconductor memory device programs, reads or erases data using several different levels of voltages. A power supply circuit for supplying power is designed and produced based on the main part memory cell array which has a larger capacity and a shorter boosting time.

A regulator circuit, which is used as a certain type of power supply circuit, oscillates easier when the capacity of the memory cell array is smaller. When the ROM memory cell array is selected to be supplied with power, an output terminal is connected to a well of a substrate in order to prevent the oscillation of the regulator circuit. The capacity of the well is used as a stabilization capacity for preventing the oscillation of the regulator circuit. In this way, in a general semiconductor memory device, the capacity of a well is used as a stabilization capacity for the regulator. Therefore, it is necessary to increase the area of the well in order to obtain a large stabilization capacity, which increases the area of the chip on which the semiconductor memory device is mounted.

BRIEF SUMMARY OF THE INVENTION

According to one embodiment of the present invention, a semiconductor device comprises:

a first and a second memory cell array each including a plurality of electrically reprogrammable memory cells arranged in the form of a matrix, the first memory cell array having a larger capacity than the second memory cell array;

a plurality of word lines and a plurality of bit lines connected to said plurality of memory cells;

a data program and read control section including a plurality of decoders for, when performing data programming, read or erasure with respect to a corresponding memory cell among the plurality of memory cells, selecting a corresponding word line and a corresponding bit line among said plurality of word lines and said plurality of bit lines and applying a voltage to said corresponding word line and said corresponding bit line; and a power supply circuit for supplying power to said data program and read control section, wherein when said power supply circuit is to supply power to said second memory cell array, an output terminal of said power supply circuit is electrically connected to at least one of said plurality of decoders connected to said first memory cell array.

According to one embodiment of the present invention, a semiconductor device comprises:

a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for, when performing data programming, read or erasure with respect to a corresponding memory cell among the plurality of memory cells, selecting a corresponding word line and a corresponding bit line among the plurality of word lines and the plurality of bit lines and applying a voltage to the corresponding word line and said corresponding bit line;

a power supply circuit for supplying power to said data program and read control section, wherein when said power supply circuit is to supply power to said second memory cell array, an output terminal of said power supply circuit is electrically connected to at least one of said plurality of decoders connected to said first memory cell array; and a decoder selecting circuit for, when said power supply circuit is to supply power to said second memory cell array, selecting a corresponding decoder among said plurality of decoders connected to said first memory cell array.

According to one embodiment of the present invention, an electric power supply method for a semiconductor device, said semiconductor device comprising:

a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for, when performing data programming, read or erasure with respect to a corresponding memory cell among said plurality of memory cells, selecting a corresponding word line and a corresponding bit line among said plurality of word lines and said plurality of bit lines and applying a voltage to said corresponding word line and said corresponding bit line; and a power supply circuit for supplying power to said data program and read control section;

comprises:

electrically connecting an output terminal of said power supply circuit to at least one of said plurality of decoders connected to said first memory cell array when said power supply circuit is to supply power to said second memory cell array.

DETAILED DESCRIPTION OF THE INVENTION

Hereinafter, embodiments of the present invention will be described with reference to the attached drawings. The present invention is not limited to those embodiments.

Embodiment 1

Figure 1:
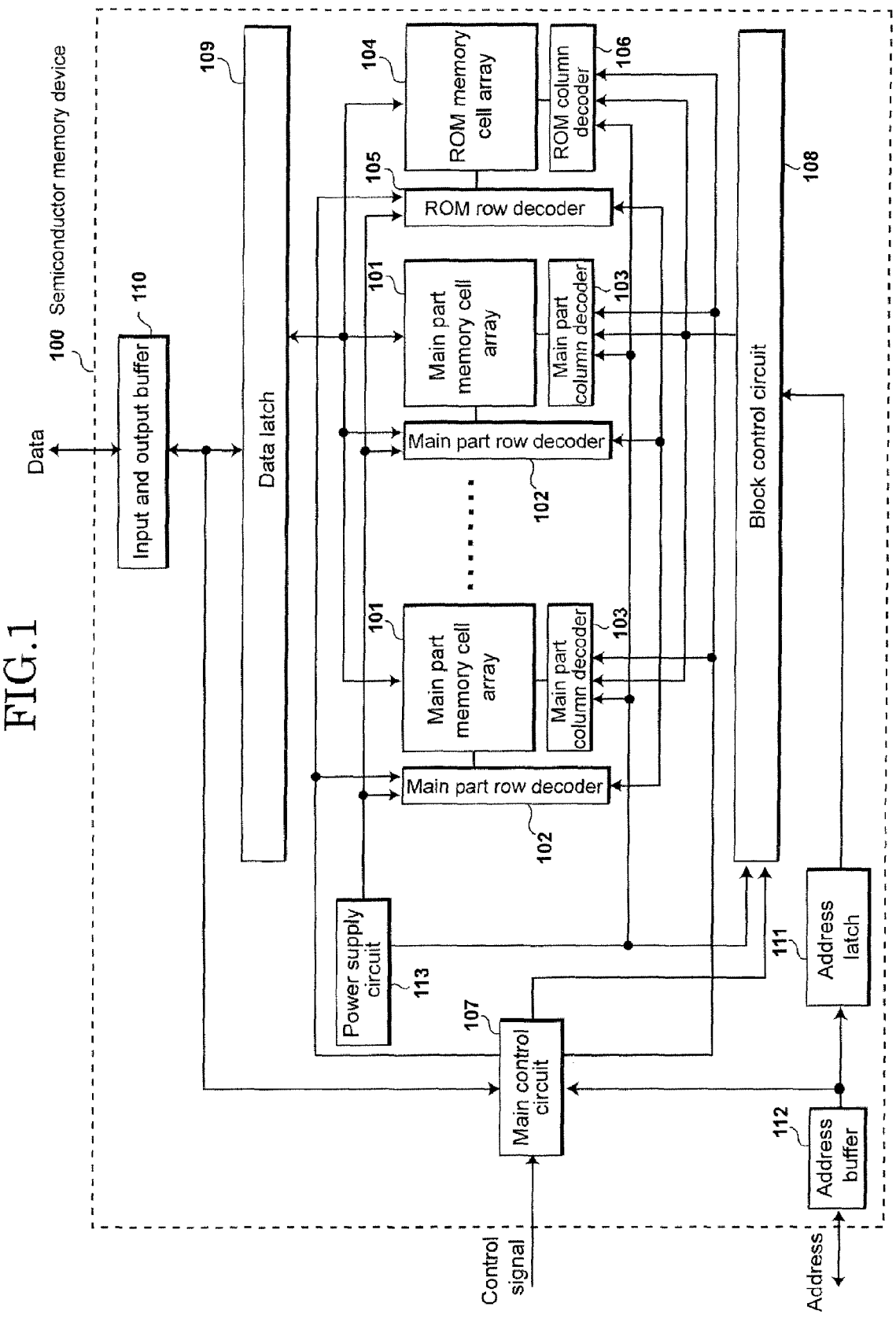
FIG. 1 is a block diagram showing a structure of a semiconductor memory device according to Embodiment 1 of the present invention.

Embodiment 1 of the present invention will be described in detail with reference to the drawings. FIG. 1 is a block diagram showing a structure of a semiconductor memory device according to Embodiment 1 of the present invention.

As shown in FIG. 1, a semiconductor memory device 100 according to Embodiment 1 of the present invention includes a plurality of main part memory cell arrays 101, a plurality of main part row decoders 102, a plurality of main part column decoders 103, a ROM memory cell array 104, a ROM row decoder 105, a ROM column decoder 106, a main control circuit 107, a block control circuit 108, a data latch 109, an input and output buffer 110, an address latch 111, an address buffer 112, and a power supply circuit 113. The plurality of main part memory cell arrays 101 and the ROM memory cell array 104 form a memory cell array. The plurality of main part row decoders 102 and the ROM row decoder 105 are included in a row decoder section. The plurality of main part column decoders 103 and the ROM column decoder 106 are included in a column decoder section.

The plurality of main part row decoders 102 and the plurality of main part column decoders 103 are connected to the plurality of main part memory cell arrays 101, respectively. The ROM row decoder 105 and the ROM column decoder 106 are connected to the ROM memory cell array 104. The power supply circuit 113 is connected to, and supplies power to, the plurality of main part row decoders 102, the plurality of main part column decoders 103, the ROM row decoder 105, the ROM column decoder 106, and the block control circuit 108.

The main control circuit 107 is connected to, and controls, the block control circuit 108, the data latch 109, the input and output buffer 110, the address latch 111, the address buffer 112, the plurality of main part row decoders 102, the plurality of main part column decoders 103, the ROM row decoder 105, and the ROM column decoder 106. The block control circuit 108 is connected to the address latch 111, the plurality of main part row decoders 102, the plurality of main part column decoders 103, the ROM row decoder 105, and the ROM column decoder 106. The data latch 109 is connected to the input and output buffer 110, the plurality of main part memory cell arrays 101, and the ROM memory cell array 104.

The main control circuit 107 receives a control signal from an external device. The input and output buffer 110 transmits and receives data to and from the external device. The address buffer 112 transmits and receives addresses to and from the external device.

The main control circuit 107 controls the block control circuit 108, the data latch 109, the input and output buffer 110, the address latch 111, the address buffer 112, the plurality of main part row decoders 102, the plurality of main part column decoders 103, the ROM row decoder 105 and the ROM column decoder 106 based on a control signal, addresses and data received from the external device, and thus performs data read, programming or erasure with respect to a plurality of memory cells included in the plurality of main part memory cell arrays 101 and the ROM memory cell array 104. The main control circuit 107, the block control circuit 108, the plurality of main part row decoders 102, the plurality of main part column decoders 103, the ROM row decoder 105 and the ROM column decoder 106 are included in a data program and read control section. When performing data programming or read with respect to corresponding memory cells among the plurality of memory cells in the main part memory cell arrays 101 or the ROM memory cell array 104, the data program and read control section selects a corresponding word line and a corresponding bit line among the plurality of word lines and the plurality of bit lines and applies a voltage to the selected corresponding word line and bit line.

Figure 2:
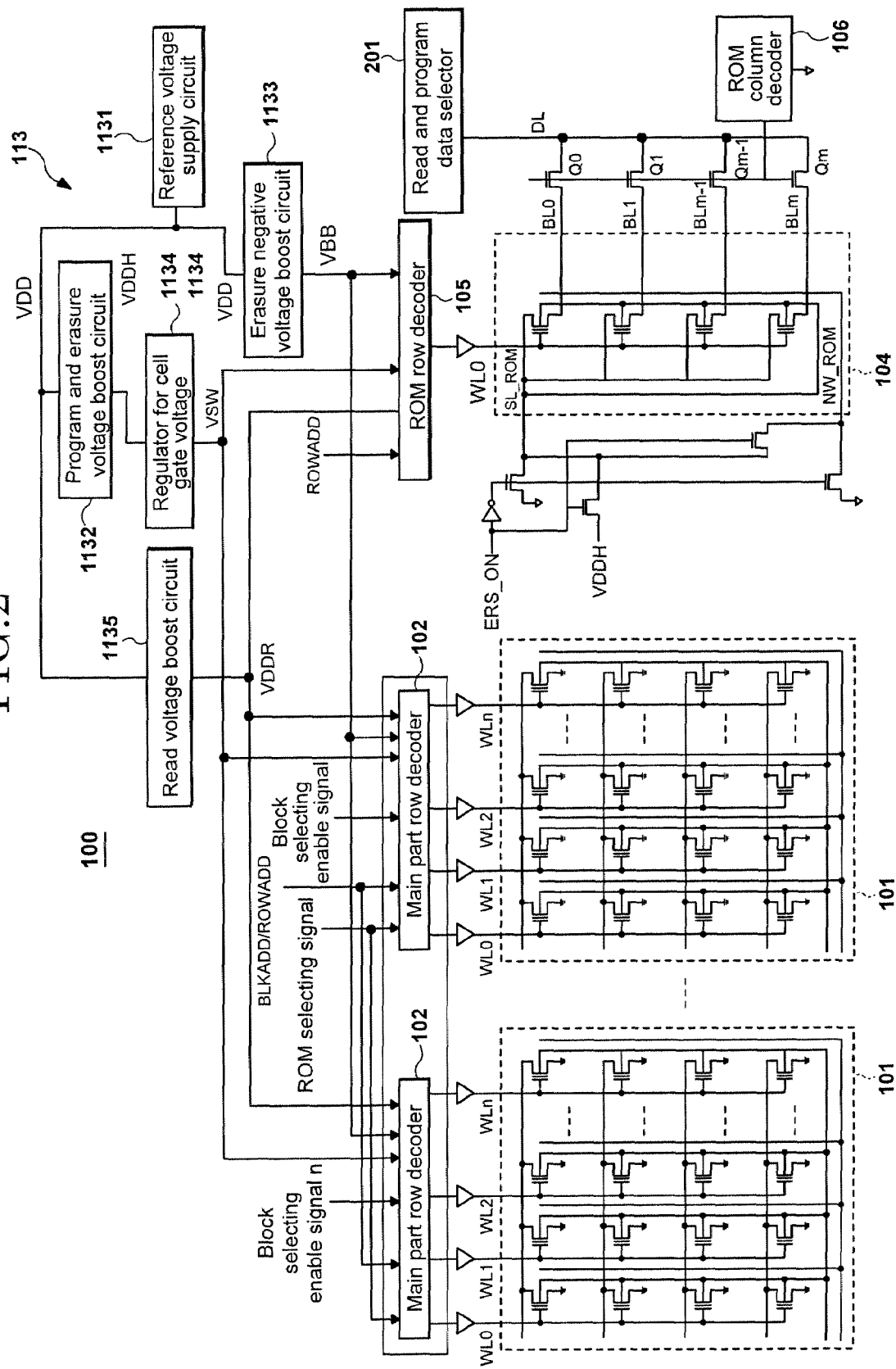
FIG. 2 is a schematic block diagram showing a structure of a part of the semiconductor memory device, including a power supply circuit, row decoders and memory cell arrays, according to Embodiment 1 of the present invention.
Figure 3:
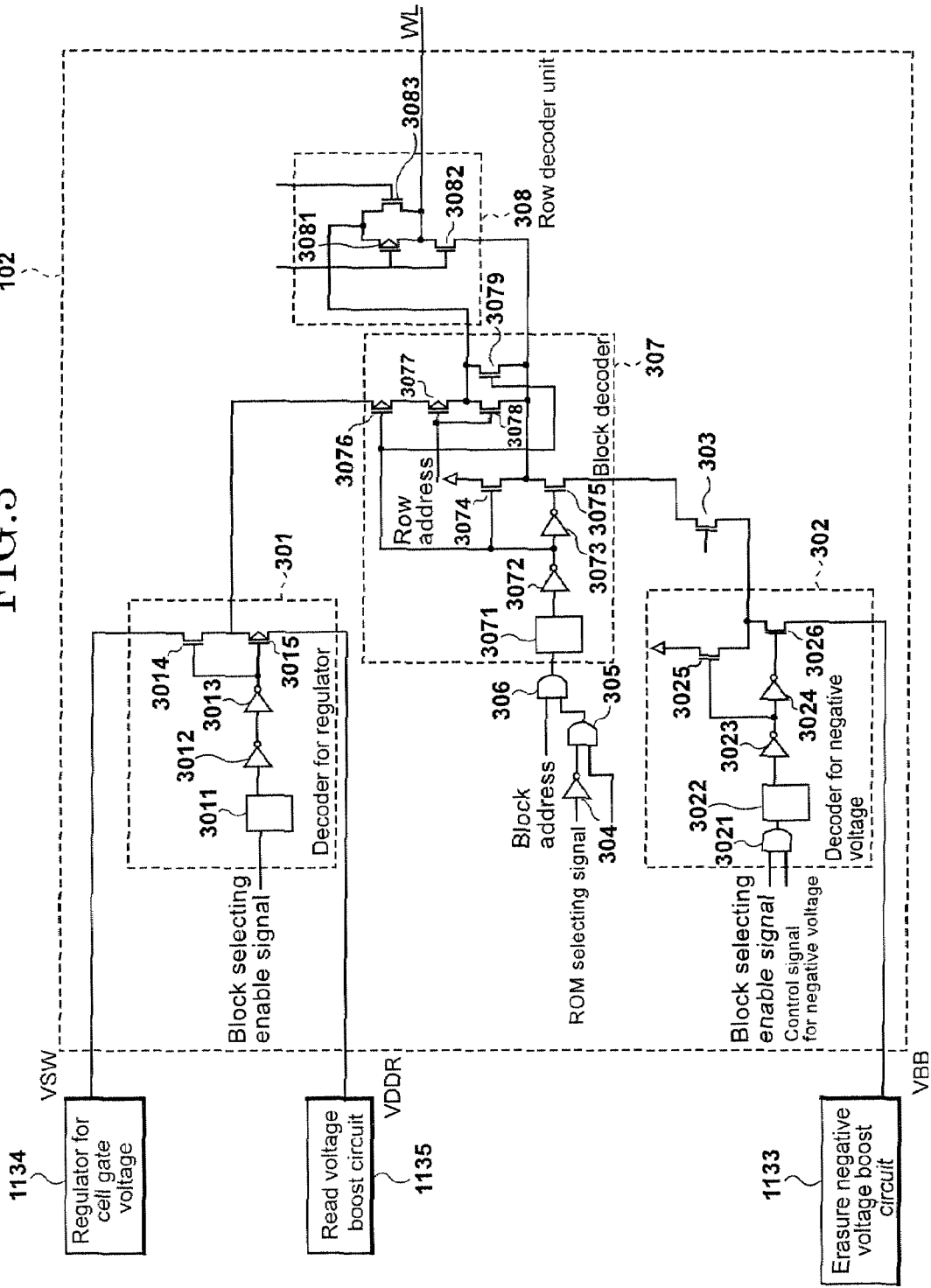
FIG. 3 is a block diagram showing a structure of a main part of the row decoder of the semiconductor memory device according to Embodiment 1 of the present invention.

FIG. 2 is a schematic block diagram showing a structure of a part of the semiconductor memory device 100, including the power supply circuit, the row decoders and the memory cell arrays, according to Embodiment 1 of the present invention. FIG. 3 is a block diagram showing a structure of a main part of the row decoder of the semiconductor memory device 100 according to Embodiment 1 of the present invention.

As shown in FIG. 2, the main part memory cell array 101 has a larger capacity (three times larger in this embodiment) than the ROM memory cell array 104. In this embodiment, the capacity of the main part memory cell array 101 is about three times larger than that of the ROM memory cell array 104, however, the present invention is not limited to this embodiment.

Each main part row decoder 102 is connected to the word lines of the corresponding main part memory cell array 101. The ROM row decoder 105 is connected to the word lines of the ROM memory cell array 104.

The power supply circuit 113 includes a reference voltage supply circuit 1131, a program and erasure positive voltage boost circuit 1132, an erasure negative voltage boost circuit 1133, a regulator 1134 for cell gate voltage, and a read voltage boost circuit 1135.

An input terminal of the program and erasure positive voltage boost circuit 1132 is connected to an output terminal of the reference voltage supply circuit 1131. An input terminal of the erasure negative voltage boost circuit 1133 is connected to the output terminal of the reference voltage supply circuit 1131. An output terminal of the erasure negative voltage boost circuit 1133 is connected to an input terminal of each of the plurality of main part row decoders 102 and an input terminal of the ROM row decoder 105. An input terminal of the regulator 1134 for cell gate voltage is connected to an output terminal of the program and erasure positive voltage boost circuit 1132. An output terminal of the regulator 1134 for cell gate voltage is connected to the input terminal of each of the plurality of main part row decoders 102 and the input terminal of the ROM row decoder 105. An input terminal of the read voltage boost circuit 1135 is connected to the output terminal of the reference voltage supply circuit 1131. An output terminal of the read voltage boost circuit 1135 is connected to the input terminal of each of the plurality of main part row decoders 102 and the input terminal of the ROM row decoder 105.

The reference voltage supply circuit 1131 supplies a predetermined reference voltage to the program and erasure positive voltage boost circuit 1132. The program and erasure positive voltage boost circuit 1132 boosts the predetermined reference voltage received from the reference voltage supply circuit 1131 to generate a program voltage and an erasure positive voltage, and supplies the program voltage and the erasure positive voltage to the regulator 1134 for cell gate voltage. The reference voltage supply circuit 1131 also supplies the predetermined reference voltage to the erasure negative voltage boost circuit 1133. The erasure negative voltage boost circuit 1133 boosts the predetermined reference voltage received from the reference voltage supply circuit 1131 to generate an erasure negative voltage. The reference voltage supply circuit 1131 also supplies the predetermined reference voltage to the read voltage boost circuit 1135. The read voltage boost circuit 1135 boosts the predetermined reference voltage received from the reference voltage supply circuit 1131 to generate a read voltage.

The ROM memory cell array 104 is connected to a read and program data selector 201, a ROM column decoder 106, and the like.

The plurality of main part row decoders 102 and the ROM row decoder 105 receive a control signal from the main control circuit (see FIG. 1) and selectively applies the program voltage, the erasure positive voltage, the erasure negative voltage and the read voltage received from the regulator 1134 for cell gate voltage, the erasure negative voltage boost circuit 1133 and the read voltage boost circuit 1135 to the plurality of main part memory cell arrays 101 and the ROM memory cell array 104.

As shown in FIG. 3, each main part row decoder 102 includes a decoder 301 for a regulator, a decoder 302 for negative voltage, a control transistor 303, an inverter circuit 304, two AND gate circuits 305 and 306, a block decoder 307 and a row decoder unit 308.

Three input terminals of the decoder 301 for a regulator are connected to the output terminals of the regulator 1134 for cell gate voltage, the read voltage boost circuit 1135, and the main control circuit 107. The input terminal of the decoder 302 for negative voltage is connected to the output terminals of the erasure negative voltage boost circuit 1133 and the main control circuit 107. A gate electrode of the control transistor 303 is connected to the output terminal of the main control circuit 107. The control transistor 303 is also connected between the decoder 302 for negative voltage and the block decoder 307.

An input terminal of the inverter circuit 304 is connected to the output terminal of the main control circuit 107. Two input terminals of the AND gate circuit 305 are respectively connected to the output terminals of the main control circuit 107 and the inverter circuit 304. Two input terminals of the AND gate circuit 306 are respectively connected to the output terminals of the main control circuit 107 and the AND gate terminal 305. An output terminal of the AND gate circuit 306 is connected to an input terminal of the block decoder 307.

One of input terminals of the block decoder 307 is connected to the decoder 301 for a regulator. The other input terminal of the block decoder 307 is connected to an output terminal of the decoder 302 for negative voltage via the control transistor 303. An input terminal of the row decoder unit 308 is connected to an output terminal of the block decoder 307. An output terminal of the row decoder unit 308 is connected to the word line WLn.

The main part row decoder 102 receives a block selecting enable signal, a block address, a ROM selecting signal, a control signal for negative voltage and the like as the control signals from the main control signal 107 (see FIG. 1). The "ROM selecting signal" refers to a signal for selecting to supply power only to the ROM memory cell array 104 and instructing the power supply circuit 113 of such a selection.

The decoder 301 for a regulator includes a level shifter 3011, two inverter circuits 3012 and 3013, and two transistors 3014 and 3015.

An input terminal of the level shifter 3011 is connected to the output terminal of the main control circuit 107. The two inverter circuits 3012 and 3013 are connected in series between an output terminal of the lever shifter 3011 and gate electrodes of the two transistors 3014 and 3015. The two transistors 3014 and 3015 are connected in series. The transistor 3014 is connected to the output terminal of the regulator 1134 for cell gate voltage. The transistor 3015 is connected to the output terminal of the read voltage boost circuit 1135. A common node of the two transistors 3014 and 3015 is an output terminal of the decoder 301 for a regulator. The output terminal of the decoder 301 for a regulator is connected to one of the input terminals of the block decoder 307.

When receiving a block selecting enable signal, the level shifter 3011 sets the potentials of the gate electrodes of the two transistors 3014 and 3015 to a High level via the two inverter circuits 3012 and 3033 and thus the two transistors 3014 and 3015 are switched ON. When the two transistors 3014 and 3015 are switched ON, the transistor 3014 or 3015 turns on the voltage from the regulator 1134 for cell gate voltage or the read voltage boost circuit 1135. As a result, when the two transistors 3014 and 3015 are switched ON, an output signal from the decoder 301 for a regulator (an output terminal of the decoder 301 for a regulator) is at a High level.

When the level shifter 3011 is receiving no block selecting enable signal, the level shifter 3011 sets the potentials of the gate electrodes of the two transistors 3014 and 3015 to a Low level via the two inverter circuits 3012 and 3013 and thus the two transistors 3014 and 3015 are switched OFF. When the two transistors 3014 and 3015 are switched OFF, neither the transistor 3014 nor 3015 turns on the voltage from the regulator 1134 for cell gate voltage or the read voltage boost circuit 1135. As a result, the output signal from the decoder 301 for a regulator (an output terminal of the decoder 301 for a regulator) is at a Low level.

The decoder 302 for negative voltage includes an AND gate circuit 3021, a level shifter 3022, two inverter circuits 3023 and 3024, and two transistors 3025 and 3026.

An input terminal of the AND gate circuit 3021 is connected to the output terminal of the main control circuit 107. An input terminal of the level shifter 3022 is connected to an output terminal of the AND gate circuit 3021. The inverter circuit 3023 is connected between an output terminal of the level shifter 3022 and a gate electrode of the transistor 3025. The inverter circuit 3024 is connected between an output terminal of the inverter circuit 3023 and a gate electrode of the transistor 3026.

The transistors 3025 and 3026 are connected in series. The transistor 3026 is connected to the output terminal of the erasure negative voltage boost circuit 1133. A common node of the two transistors 3025 and 3026 is the output terminal of the decoder 302 for negative voltage. The output terminal of the decoder 302 for negative voltage is connected to one of the input terminals of the block decoder 307 via the control transistor 303.

When the AND gate circuit 3021 is receiving a block selecting enable signal and a control signal for negative voltage from the main control circuit 107, an output signal of the AND gate circuit 3021 is set at a High level "1". When the output signal from the AND gate circuit 3021 is at the High level "1", the level shifter 3022 sets the potentials of the gate electrodes of the transistors 3025 and 3026 to a High level "1" via the inverter circuits 3023 and 3024 and thus the two transistors 3025 and 3026 are switched ON. When the transistors 3025 and 3026 are switched ON, the transistor 3025 or 3026 turns on the voltage from the erasure negative voltage boost circuit 1133. As a result, an output signal from the decoder 302 for negative voltage is at a High level. At this point, the main control circuit 107 applies a control signal for negative voltage to the gate electrode of the control transistor 303 and thus the control transistor 303 is switched ON. Therefore, the output signal at the High level from the decoder 302 for negative voltage is applied to one of the input terminals of the block decoder 307 via the control transistor 303.

When the AND gate circuit 3021 is not receiving at least the block selecting enable signal or the control signal for negative voltage from the main control circuit 107, an output signal of the AND gate circuit 3021 is set at a Low level "0". When the output signal from the AND gate circuit 3021 is at the Low level "0", the level shifter 3022 sets the potentials of the gate electrodes of the transistors 3025 and 3026 to a Low level "0" via the inverter circuits 3023 and 3024 and thus the two transistors 3025 and 3026 are switched OFF. When the transistors 3025 and 3026 are in the OFF state, neither the transistor 3025 nor 3026 turns on the voltage from the erasure negative voltage boost circuit 1133. As a result, the output signal from the decoder 302 for negative voltage is at a Low level. At this point, the main control circuit 107 does not apply a control signal for negative voltage to the gate electrode of the control transistor 303 and thus the control transistor 303 is switched OFF. Therefore, no output signal from the decoder 302 for negative voltage is applied to any input terminal of the block decoder 307.

When the inverter circuit 304 is receiving a ROM selecting signal from the main control circuit 107, an output signal of the inverter circuit 304 is set at a Low level; whereas when the inverter circuit 304 is receiving no ROM selecting signal from the main control circuit 107, the output signal of the inverter circuit 304 is set at a High level. The AND gate circuit 305 receives the output signal from the inverter circuit 304 and a block selecting enable signal from the main control circuit 107.

When the AND gate circuit 305 receives a block selecting enable signal while the output signal from the inverter circuit 304 is at a Low level, i.e., while the inverter circuit 304 is receiving a ROM selecting signal from the main control circuit 107, an output signal from the AND gate circuit 305 is at a Low level. When the output signal from the inverter circuit 304 is at a High level, i.e., when the inverter circuit 304 is receiving no ROM selecting signal from the main control circuit 107, the output signal from the AND gate circuit 305 is at a High level.

The AND gate circuit 306 receives a block address from the main control circuit 107 and the output signal from the AND gate circuit 305. When the AND gate circuit 306 receives a block address from the main control circuit 107 while the output signal from the AND gate circuit 305 is at a High level, i.e., while the inverter circuit 304 is receiving no ROM selecting signal from the main control circuit 107, an output signal from the AND gate circuit 306 is at a High level.

When the AND gate circuit 306 receives no block address from the main control circuit 107, or when the output signal from the AND gate circuit 305 is at a Low level, i.e., when the inverter circuit 304 receives a ROM selecting signal from the main control circuit 107, the output signal from the AND gate circuit 306 is at a Low level. The AND gate circuit 306 applies the output signal to one of the input terminals of the block decoder 307.

The block decoder 307 includes a level shifter 3071, two inverter circuits 3072 and 3073, and six transistors 3074, 3075, 3076, 3077, 3078 and 3079.

An input terminal of the level shifter 3071 is connected to the output terminal of the AND gate circuit 306. The inverter circuit 3072 is connected to an output terminal of the level shifter 3071 and an input terminal of the inverter circuit 3073. Also, an output terminal of the inverter terminal 3072 is connected to gate electrodes of the transistors 3074, 3076 and 3079. An output terminal of the inverter circuit 3073 is connected to a gate electrode of the transistor 3075. The transistor 3075 is connected between the control transistor 303 and the transistor 3074.

The transistors 3076, 3077 and 3078 are connected in series between a common node of the transistors 3074 and 3075 and the common node of the transistors 3014 and 3015. The output terminal of the inverter circuit 3073 is also connected to the gate electrode of the transistor 3076. The transistor 3079 is connected between the common node of the transistors 3074 and 3075 and a common node of the transistors 3077 and 3078. The common node of the transistors 3074 and 3075 and the common node of the transistors 3077 and 3078 are output terminals of the block decoder 307.

When the output signal from the AND gate circuit 306 is at a High level, the level shifter 3071 sets the potentials of the gate electrodes of the transistors 3074, 3075, 3076 and 3079 to a High level via the inverter circuits 3072 and 3073 and thus the transistors 3074, 3075, 3076 and 3079 are switched ON.

When the inverter circuit 304 receives no ROM selecting signal while the AND gate circuit 305 is receiving a block selecting enable signal while the AND gate circuit 306 is receiving a block address, the level shifter 3071 sets the potentials of the gate electrodes of the transistors 3074, 3075, 3076 and 3079 to a High level via the inverter circuits 3072 and 3073 and thus the transistors 3074, 3075, 3076 and 3079 are switched ON. The gate electrodes of the transistors 3077 and 3078 are supplied with a row address from the main control circuit 107.

When the transistors 3076 and 3079 are switched ON while the output signal from the decoder 301 for a regulator is at a High level, i.e., while the level shifter 3011 is receiving a block selecting enable signal, the voltage of the regulator 1134 for cell gate voltage or the read voltage boost circuit 1135 is turned on by the transistor 3076. As a result, an output signal from the common node of the transistors 3074 and 3075 and an output signal from the common node of the transistors 3077 and 3078 are set at a predetermined first voltage level and applied to the row decoder unit 308.

When the transistors 3075 and 3079 are switched ON while the output signal from the decoder 302 for negative voltage is at a High level, the erasure negative voltage of the erasure negative voltage boost circuit 1133 is applied to the transistors 3075 and 3079 via the control transistor 303. As a result, the output signal from the common node of the transistors 3074 and 3075 and the output signal from the common node of the transistors 3077 and 3078 are set at a predetermined second voltage level and applied to the row decoder unit 308.

In this state, i.e., when the main control circuit 107 does not provide the main part row decoder 102 with a ROM selecting signal for selecting to supply power only to the ROM memory cell array 104 and instructing the power supply circuit 113 of such a selection, the data programming and read control section can perform data programming, read and erasure with respect to the memory cells in the plurality of main part memory cell arrays 101.

When the output signal from the AND gate circuit 306 is at a Low level, the level shifter 3071 sets the potentials of the gate electrodes of the transistors 3074, 3075, 3076 and 3079 at a Low level via the inverter circuits 3072 and 3073 and thus the transistors 3074, 3075, 3076 and 3079 are switched OFF.

That is, when the inverter circuit 304 receives a ROM selecting signal, the level shifter 3071 sets the potentials of the gate electrodes of the transistors 3074, 3075, 3076 and 3079 to a Low level via the inverter circuits 3072 and 3073 and thus the transistors 3074, 3075, 3076 and 3079 are switched OFF.

When the transistors 3076 and 3079 are switched OFF, the voltage of neither the regulator 1134 for cell gate voltage nor the read voltage boost circuit 1135 is turned on by the transistor 3076. As a result, the output signal from the common node of the transistors 3074 and 3075 and the output signal from the common node of the transistors 3077 and 3078 are set at a Low level and thus the row decoder unit 308 does not operate. That is, the row decoder unit 308 does not receive any power from the block decoder 307.

In this state, i.e., when the main control circuit 107 provides the main part row decoder 102 with a ROM selecting signal for selecting to supply power only to the ROM memory cell array 104 and instructing the power supply circuit 113 of such a selection, the output terminal of the regulator 1134 for cell gate voltage in the power supply circuit 113 is connected to one of the plurality of main part row decoders 102 connected to the main part memory cell arrays 101. Specifically, at this point, the decoder 301 for a regulator and the block decoder 307 in the main part row decoder 102 are electrically connected as load capacities to the output terminal of the regulator 1134 for cell gate voltage. In this case, the decoder 301 for a regulator and the block decoder 307 in the main part row decoder 102 form a load capacity part connected to the output terminal of the regulator 1134 for cell gate voltage.

In this state, i.e., when the main control circuit 107 provides the main part row decoder 102 with a ROM selecting signal for selecting to supply power only to the ROM memory cell array 104 and instructing the power supply circuit 113 of such a selection, the data program and write control section cannot perform data programming or read with respect to the memory cells in the plurality of main part memory cell arrays 101 included in the memory cell array.

When the transistors 3075 and 3079 are switched OFF while the output signal from the decoder 302 for negative voltage is at a High level, the erasure negative voltage of the erasure negative voltage boost circuit 1133 is not turned on by the transistor 3075 or 3079. As a result, the output signal from the common node of the transistors 3074 and 3075 and the output signal from the common node of the transistors 3077 and 3078 are set at a Low level and thus the row decoder unit 308 does not operate. That is, the row decoder unit 308 does not receive any power from the block decoder 307. In this state, i.e., when the main control circuit 107 provides the main part row decoder 102 with a ROM selecting signal for selecting to supply power only to the ROM memory cell array 104 and instructing the power supply circuit 113 of such a selection, the data program and write control section cannot perform data erasure with respect to the memory cells in the plurality of main part memory cell arrays 101 included in the memory cell array.

The row decoder unit 308 includes three transistors 3081, 3082 and 3083. The transistors 3081 and 3082 are connected in series between the common node of the transistors 3074 and 3075 and the common node of the transistors 3077 and 3078. The transistor 3083 is connected between the common node of the transistors 3077 and 3078 and a common node of the transistors 3081 and 3082. Gate electrodes of the transistors 3081, 3082 and 3083 are supplied with a control signal from the main control circuit 107. The common node of the transistors 3081 and 3082 is connected to the word line WLn.

According to Embodiment 1 of the present invention, when the power supply circuit 113 is to supply power to the ROM memory cell array 104, the output terminal of the power supply circuit 113 is connected to one of the plurality of decoders connected to the main part memory cell array 101 having a larger capacity than the ROM memory cell array 104, and the capacity of this decoder is used as a stabilization capacity for the power supply circuit 113. Therefore, the area of the chip on which the semiconductor memory device is mounted can be reduced.

Embodiment 2

Figure 4:
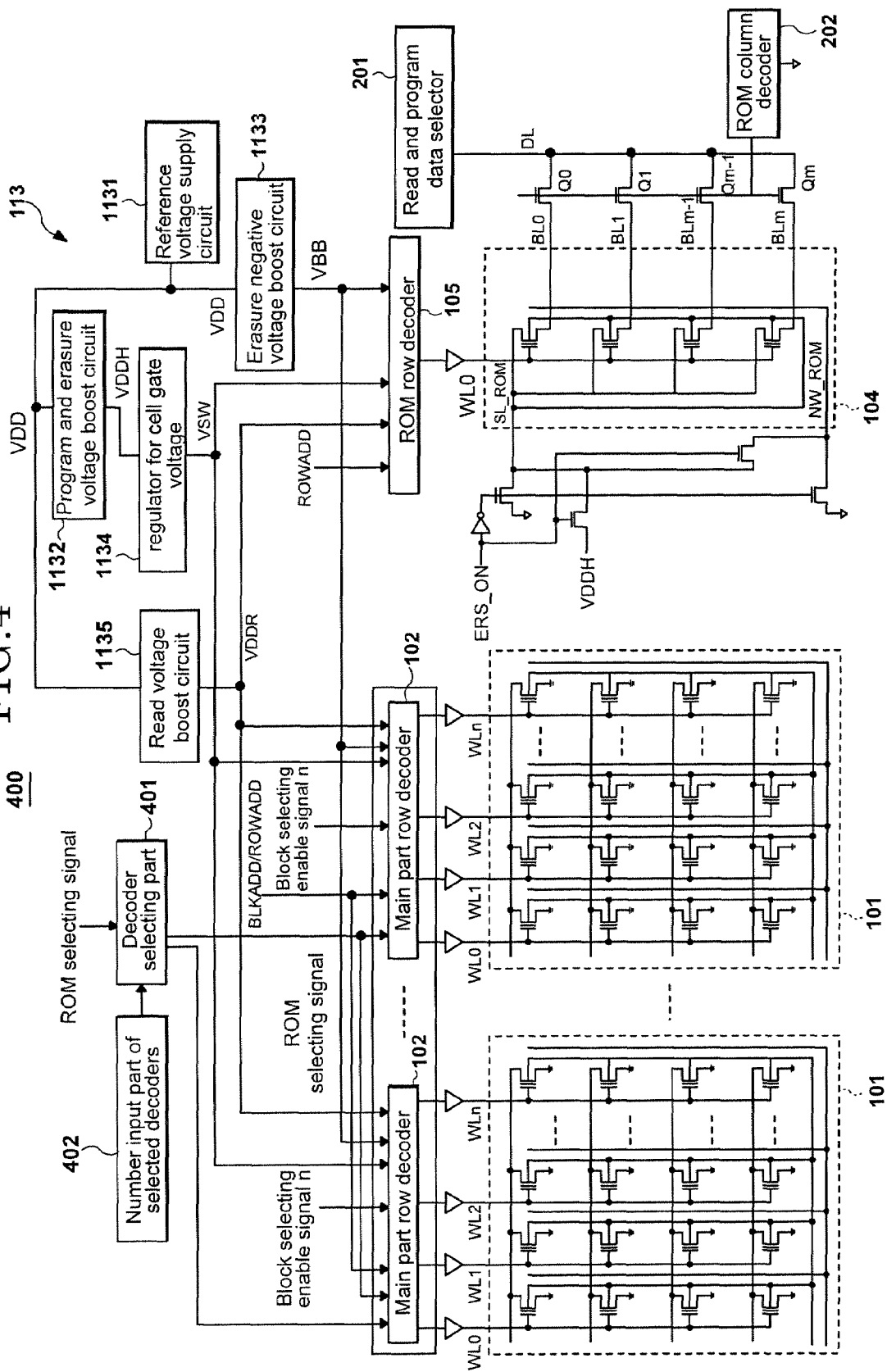
FIG. 4 is a schematic block diagram showing a structure of a part of a semiconductor memory device, including a power supply circuit, row decoders and memory cell arrays, according to Embodiment 2 of the present invention.

Next, Embodiment 2 will be described with reference to FIG. 4. FIG. 4 is a schematic block diagram showing a structure of a part of a semiconductor memory device 400, including a power supply circuit, row decoders and memory cell arrays, according to Embodiment 2 of the present invention. Regarding Embodiment 2 of the present invention, identical numerals are allocated to the identical elements of those in Embodiment 1 described above, and descriptions thereof will be omitted.

As shown in FIG. 4, the semiconductor memory device 400 according to Embodiment 2 of the present invention includes a decoder selecting part 401 and a number input part 402 of selected decoders in addition to the elements included in the semiconductor memory device 100 according to Embodiment 1 of the present invention.

The decoder selecting part 401 is connected to the main control circuit 107, the number input part 402 of selected decoders and the plurality of main part row decoders 102. The number input part 402 of selected decoders is provided for inputting a value representing the number of selected decoders in advance and applying such an input value to the decoder selecting part 401.

The decoder selecting part 401 receives the input value from the number input part 402 of selected decoders, and also receives a ROM selecting signal from the main control circuit 107. When receiving the ROM selecting signal, the decoder selecting part 401 generates the same number of ROM selecting signals as the input value representing the number of selected decoders, and respectively applies the generated ROM selecting signals to the same number of main part row decoders 102 as the input value.

Except for the above-described point, the semiconductor 400 according to Embodiment 2 of the present invention is the same as the semiconductor 100 according to Embodiment 1 of the present invention in structure and operation.

In Embodiments 1 and 2 of the present invention, the decoder to be connected to the output terminal of the power supply circuit 113 when the power supply circuit 113 is to supply power to the ROM memory cell array 104 may be the column decoder described above or both the row decoder and the column decoder.

The present invention is not limited to Embodiments 1 and 2, and is applicable to any semiconductor device which includes first and second memory cell arrays each including a plurality of electrically reprogrammable memory cells arranged in the form of a matrix; a data program and read control section including a plurality of decoders for performing data programming, read or erasure with respect to the first and second of memory cell arrays; and a power supply circuit for supplying power to the data program and read control section; wherein the second memory cell array is a memory cell array having a smaller capacity than the first memory cell array, and when the power supply circuit is to supply power to the second memory cell array, an output terminal of the power supply circuit is connected to at least one decoder among the plurality of decoders connected to the first memory cell array.

According to the present invention, when the power supply circuit is to supply power to the second memory cell array, the output terminal of the power supply circuit is connected to at least one of the plurality of decoders connected to the first memory cell array having a larger capacity than the second memory cell array, and the capacity of this decoder is used as a stabilization capacity for the power supply circuit. Therefore, the area of the chip on which the semiconductor memory device is mounted can be reduced.

In Embodiments 1 and 2 of the present invention, the first memory cell array and the second memory cell array may be NAND type memory cell arrays respectively, and NOR type memory cell arrays respectively.

We claim:

1. A semiconductor device comprising:
a first and a second memory cell array each including a plurality of electrically reprogrammable memory cells arranged in the form of a matrix, the first memory cell array having a larger capacity than the second memory cell array;
a plurality of word lines and a plurality of bit lines connected to said plurality of memory cells;
a data program and read control section including a plurality of decoders for read or erasure with respect to a corresponding memory cell among the plurality of memory cells, selecting a corresponding word line and a corresponding bit line among said plurality of word lines and said plurality of bit lines and applying a voltage to said corresponding word line and said corresponding bit line when performing data programming; and
a power supply circuit for supplying power to said data program and read control section, wherein when said power supply circuit is to supply power to said second memory cell array, said power supply circuit is to supply power to at least one of said plurality of decoders connected to said first memory cell array and said one of said plurality of decoders connected to said first memory cell array is electrically disconnected from said corresponding word line.

2. A semiconductor device comprising:
a first and second memory cell array each including a plurality of electrically reprogrammable memory cells arranged in the form of a matrix, the first memory cell array having a larger capacity than the second memory cell array:
a plurality of word lines and a plurality of bit lines connected to said plurality of memory cells;
a data program and read control section including a plurality of decoders for read or erasure with respect to a corresponding memory cell among the plurality of memory cells, selecting a corresponding word line and a corresponding bit line among said plurality of word lines and said plurality of bit lines and applying a voltage to said corresponding word line and said corresponding bit line when performing data programming; and
power supply circuit for supplying power to said data program and read control section, wherein when said power supply circuit is to supply power to said second memory cell array, an output terminal of said power supply circuit is electrically connected to at least one of said plurality of decoders connected to said first memory cell array,
wherein said first memory cell array is a main part memory cell array and said second memory cell array is a ROM memory cell array.

3. The semiconductor device according to claim 1, wherein said plurality of decoders include a column decoder and a row decoder, and at least one decoder to which said output terminal of said power supply circuit is electrically connected is said column decoder or said row decoder.

4. A semiconductor device comprising:
a first and second memory cell array each including a plurality of electrically reprogrammable memory cells arranged in the form of a matrix, the first memory cell array having a larger capacity than the second memory cell array;
a plurality of word lines and a plurality of bit lines connected to said plurality of memory cells;
a data program and read control section including a plurality of decoders for read or erasure with respect to a corresponding memory cell among the plurality of memory cells, selecting a corresponding word line and a corresponding bit line among said plurality of word lines and said plurality of bit lines and applying a voltage to said corresponding word line and said corresponding bit line when performing data programming; and
a power supply circuit for supplying power to said data program and read control section, wherein when said power supply circuit is to supply power to said second memory cell array, an output terminal of said power supply circuit is electrically connected to at least one of said plurality of decoders connected to said first memory cell array,
wherein said power supply circuit includes a regulator for cell gate voltage for controlling a voltage to be supplied to a gate of said corresponding memory cell among said plurality of memory cells, and a read voltage boost circuit for controlling a voltage to be supplied to a gate of said corresponding memory cell among said plurality of memory cells for reading data from said corresponding memory cell.

5. The semiconductor device according to claim 4, wherein when said power supply circuit is to supply power to said second memory cell array, an output terminal of said regulator for cell gate voltage and an output terminal of said read voltage boost circuit in said power supply circuit are electrically connected to at least one of said plurality of decoders connected to said first memory cell array.

6. The semiconductor device according to claim 1, wherein said at least one of said plurality of decoders forms a means for load capacity.

7. The semiconductor device according to claim 1, wherein said semiconductor device is a NAND type nonvolatile memory device.

8. A semiconductor device comprising:
a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for read or erasure with respect to a corresponding memory cell among said plurality of memory cells, selecting a corresponding word line and a corresponding bit line among the plurality of word lines and the plurality of bit lines and applying a voltage to the corresponding word line and said corresponding bit line when performing data programming;

a power supply circuit for supplying power to said data program and read control section, wherein when said power supply circuit is to supply power to said second memory cell array, an output terminal of said power supply circuit is electrically connected to at least one of said plurality of decoders connected to said first memory cell array; and a decoder selecting circuit for, when said power supply circuit is to supply power to said second memory cell array, selecting a corresponding decoder among said plurality of decoders connected to said first memory cell array.

9. The semiconductor device according to claim 8, wherein said first memory cell array is a main part memory cell array and said second memory cell array is a ROM memory cell array.

10. The semiconductor device according to claim 8, wherein the plurality of decoders include a column decoder and a row decoder, and said at least one decoder to which said output terminal of said power supply circuit is electrically connected is said column decoder or said row decoder.

11. The semiconductor device according to claim 8, wherein said power supply circuit includes a regulator for cell gate voltage for controlling a voltage to be supplied to a gate of said corresponding memory cell among said plurality of memory cells, and a read voltage boost circuit for controlling a voltage to be supplied to a gate of said corresponding memory cell among said plurality of memory cells for reading data from said corresponding memory cell.

12. The semiconductor device according to claim 11, wherein when said power supply circuit is to supply power to said second memory cell array, an output terminal of said regulator for cell gate voltage and an output terminal of said read voltage boost circuit in said power supply circuit are electrically connected to at least one of said plurality of decoders connected to said first memory cell array.

13. The semiconductor device according to claim 8, wherein said at least one of said plurality of decoders forms a means for load capacity.

14. The semiconductor device according to claim 8, wherein said semiconductor device is a NAND type nonvolatile memory device.

15. An electric power supply method for a semiconductor device, said semiconductor device comprising:

a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for read or erasure with respect to a corresponding memory cell among said plurality of memory cells, selecting a corresponding word line and a corresponding bit line among said plurality of word lines and said plurality of bit lines and applying a voltage to said corresponding word line and said corresponding bit line when performing data programming; and a power supply circuit for supplying power to said data program and read control section;

said method comprising:

electrically connecting an output terminal of said power supply circuit to at least one of said plurality of decoders connected to said first memory cell array and electrically disconnecting said one of said plurality of decoders connected to said first memory cell array from said corresponding word line when said power supply circuit is to supply power to said second memory cell array.

16. An electric power supply method for a semiconductor device, said semiconductor device comprising:

a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for read or erasure with respect to a corresponding memory cell among said plurality of memory cells, selecting a corresponding word line and a corresponding bit line among said plurality of word lines and said plurality of bit lines and applying a voltage to said corresponding word line and said corresponding bit line when performing data programming; and a power supply circuit for supplying power to said data program and read control section;

said method comprising:

electrically connecting an output terminal of said power supply circuit to at least one of said plurality of decoders connected to said first memory cell array when said power supply circuit is to supply power to said second memory cell array, wherein said first memory cell array is a main part memory cell array and said second memory cell array is a ROM memory cell array.

17. The electric power supply method according to claim 15, wherein said plurality of decoders include a column decoder and a row decoder, and said at least one decoder to which said output terminal of said power supply circuit is electrically connected is said column decoder or said row decoder.

18. An electric power supply method for a semiconductor device, said semiconductor device comprising:

a first and a second memory cell array each including a plurality of electrically reprogrammable memory cells arranged in the form of a matrix, said first memory cell array having a larger capacity than said second memory cell array;

a plurality of word lines and a plurality of bit lines connected to said plurality of memory cells;

a data program and read control section including a plurality of decoders for read or erasure with respect to a corresponding memory cell among said plurality of memory cells, selecting a corresponding word line and a corresponding bit line among said plurality of word lines and said plurality of bit lines and applying a voltage to said corresponding word line and said corresponding bit line when performing data programming; and a power supply circuit for supplying power to said data program and read control section;

said method comprising:

electrically connecting an output terminal of said power supply circuit to at least one of said plurality of decoders connected to said first memory cell array when said power supply circuit is to supply power to said second memory cell array, wherein said power supply circuit includes a regulator for cell gate voltage for controlling a voltage to be supplied to a gate of said corresponding memory cell among said plurality of memory cells, and a read voltage boost circuit for controlling a voltage to be supplied to a gate of said corresponding memory cell among said plurality of memory cells for reading data from said corresponding memory cell.

19. The electric power supply method according to claim 18, wherein when said power supply circuit is to supply power to said second memory cell array, an output terminal of said regulator for cell gate voltage and an output terminal of said read voltage boost circuit in said power supply circuit are electrically connected to at least one of said plurality of decoders connected to said first memory cell array.

20. An electric power supply method according to claim 15, wherein said at least one of said plurality of decoders forms a means for load capacity.

* * * * *